(12) United States Patent
Kurihara et al.

(10) Patent No.: US 10,497,733 B2
(45) Date of Patent: Dec. 3, 2019

(54) PHOTOELECTRIC CONVERSION APPARATUS AND SYSTEM

(71) Applicant: CANON KABUSHIKI KAISHA, Tokyo (JP)

(72) Inventors: Masaki Kurihara, Koza-gun (JP); Nobuhiko Sato, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 34 days.

(21) Appl. No.: 15/717,111

(22) Filed: Sep. 27, 2017

(65) Prior Publication Data

US 2018/0097029 A1    Apr. 5, 2018

(30) Foreign Application Priority Data

Oct. 5, 2016 (JP) .................. 2016-197546

(51) Int. Cl.
*H01L 27/146* (2006.01)

(52) U.S. Cl.
CPC .. *H01L 27/14627* (2013.01); *H01L 27/14618* (2013.01)

(58) Field of Classification Search
CPC .............. H01L 27/14627; H01L 27/14618
See application file for complete search history.

(56) References Cited

U.S. PATENT DOCUMENTS

| | | | |
|---|---|---|---|
| 7,838,918 B2 | 11/2010 | Naruse et al. | |
| 8,786,739 B2 | 7/2014 | Kurihara | |
| 9,305,965 B2 | 4/2016 | Kurihara et al. | |
| 2007/0030380 A1 | 2/2007 | Higuchi et al. | |
| 2009/0008687 A1 | 1/2009 | Katsuno et al. | |
| 2010/0044816 A1 | 2/2010 | Minamio et al. | |
| 2010/0066876 A1* | 3/2010 | Kurihara ........... | H01L 27/14621 348/273 |
| 2010/0270637 A1 | 10/2010 | Katsuno et al. | |
| 2016/0035769 A1 | 2/2016 | Goden et al. | |
| 2016/0304730 A1* | 10/2016 | Hitomi ............. | H01L 27/14685 |
| 2017/0117320 A1 | 4/2017 | Matsugai | |
| 2017/0236860 A1 | 8/2017 | Yamamoto et al. | |

(Continued)

FOREIGN PATENT DOCUMENTS

| | | | | |
|---|---|---|---|---|
| JP | 2003037257 | * | 2/2003 | ....... H01L 27/14627 |
| JP | 2009-016574 A | | 1/2009 | |
| JP | 4528879 B2 | | 8/2010 | |

(Continued)

OTHER PUBLICATIONS

U.S. Appl. No. 15/665,561, filed Aug. 1, 2017 (First Named Inventor: Masaki Kurihara).

*Primary Examiner* — Marc Anthony Armand
(74) *Attorney, Agent, or Firm* — Venable LLP

(57) ABSTRACT

A photoelectric conversion apparatus has a photoelectric conversion substrate having a plurality of photoelectric conversion portions and a microlens array arranged above the plurality of photoelectric conversion portions; a light transmissive plate; a first member arranged between the photoelectric conversion substrate and the light transmissive plate; a second member arranged between the first member and the microlens array; and a third member arranged between the first member and the second member. A porosity of the first member<a porosity of the third member<a porosity of the second member is satisfied.

20 Claims, 12 Drawing Sheets

(56) References Cited

U.S. PATENT DOCUMENTS

2017/0271389 A1  9/2017  Yamamoto et al.

FOREIGN PATENT DOCUMENTS

| JP | 5185019 B2 | 4/2013 |
| JP | 2015-159275 A | 9/2015 |
| JP | 2016-001681 A | 1/2016 |
| WO | 2015/111419 A2 | 7/2015 |
| WO | 2015/190070 A1 | 12/2015 |

* cited by examiner

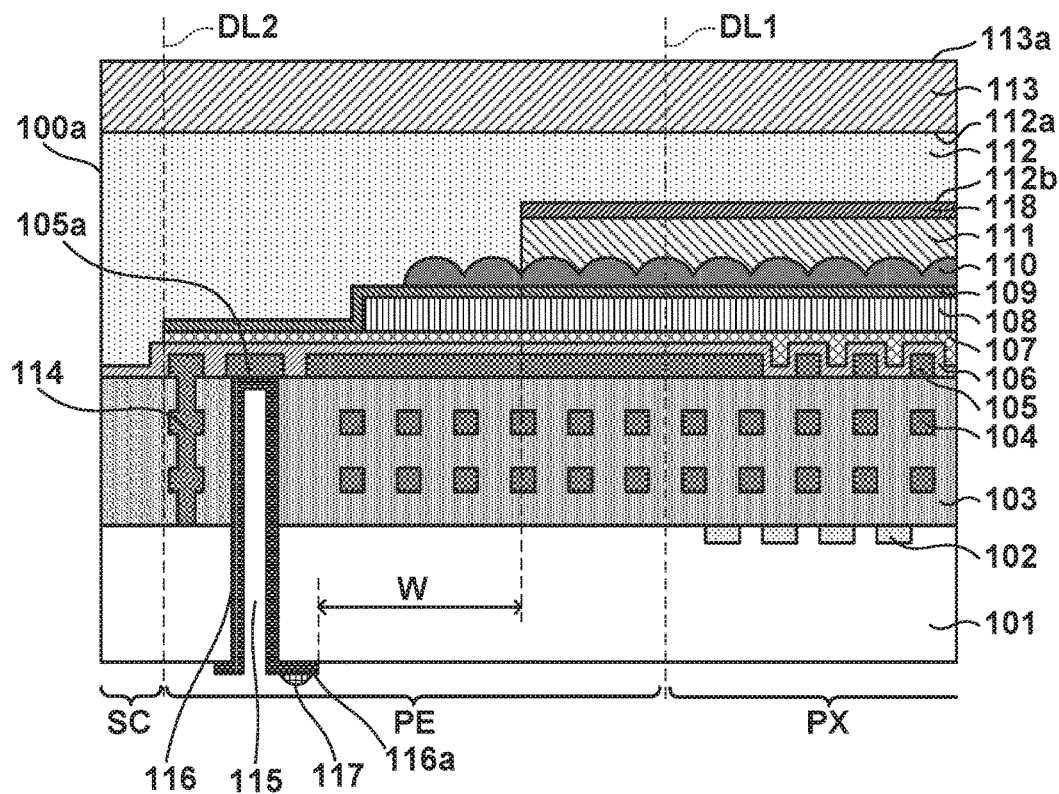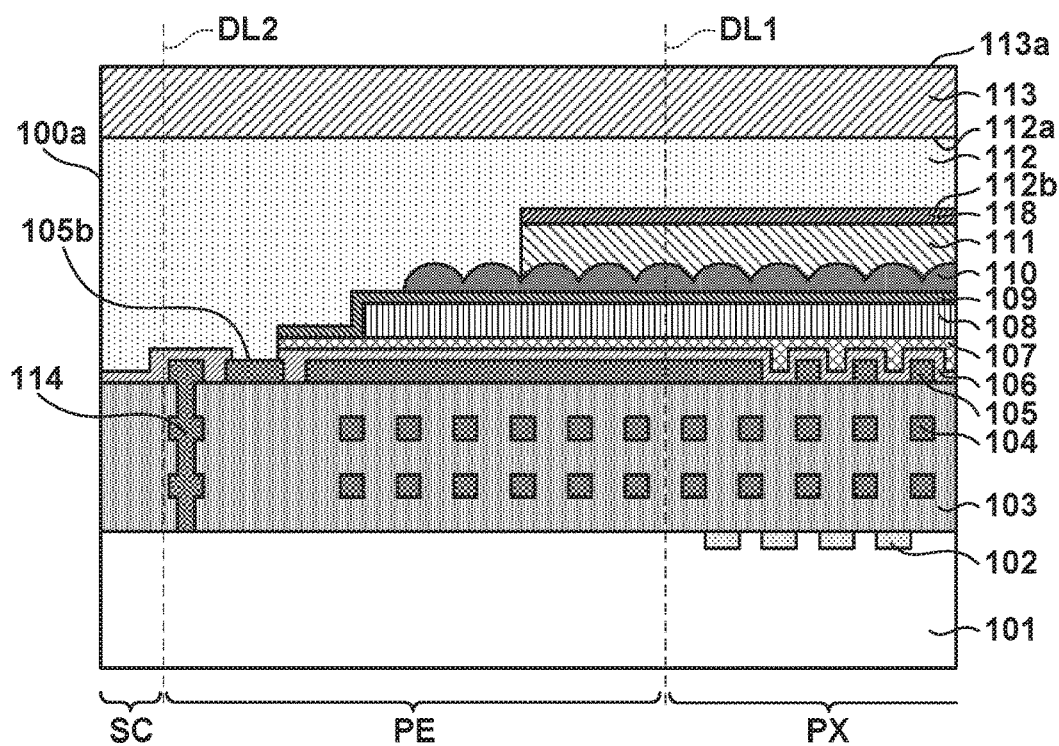

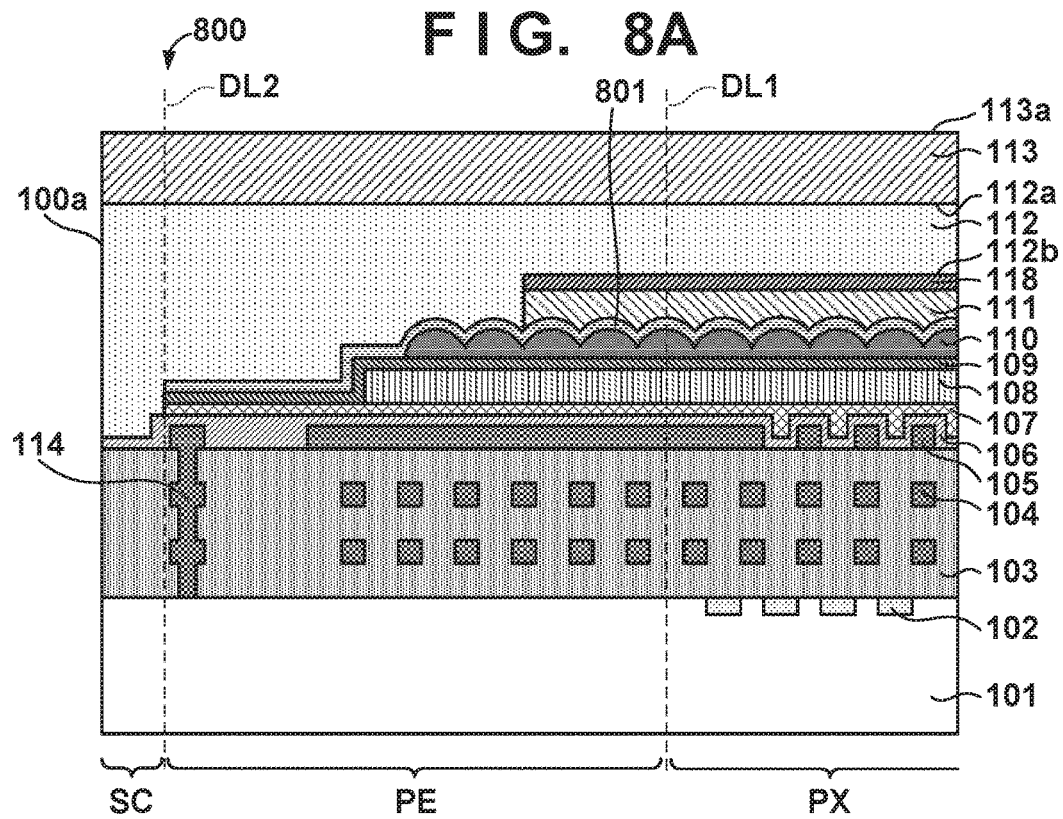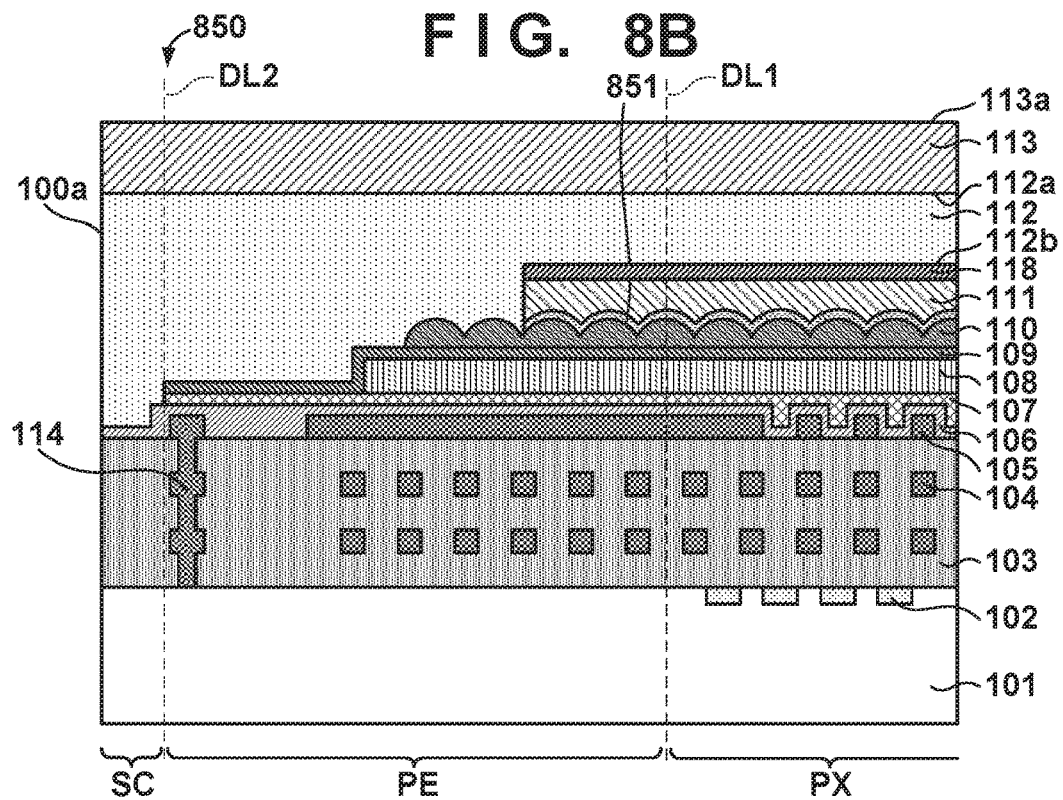

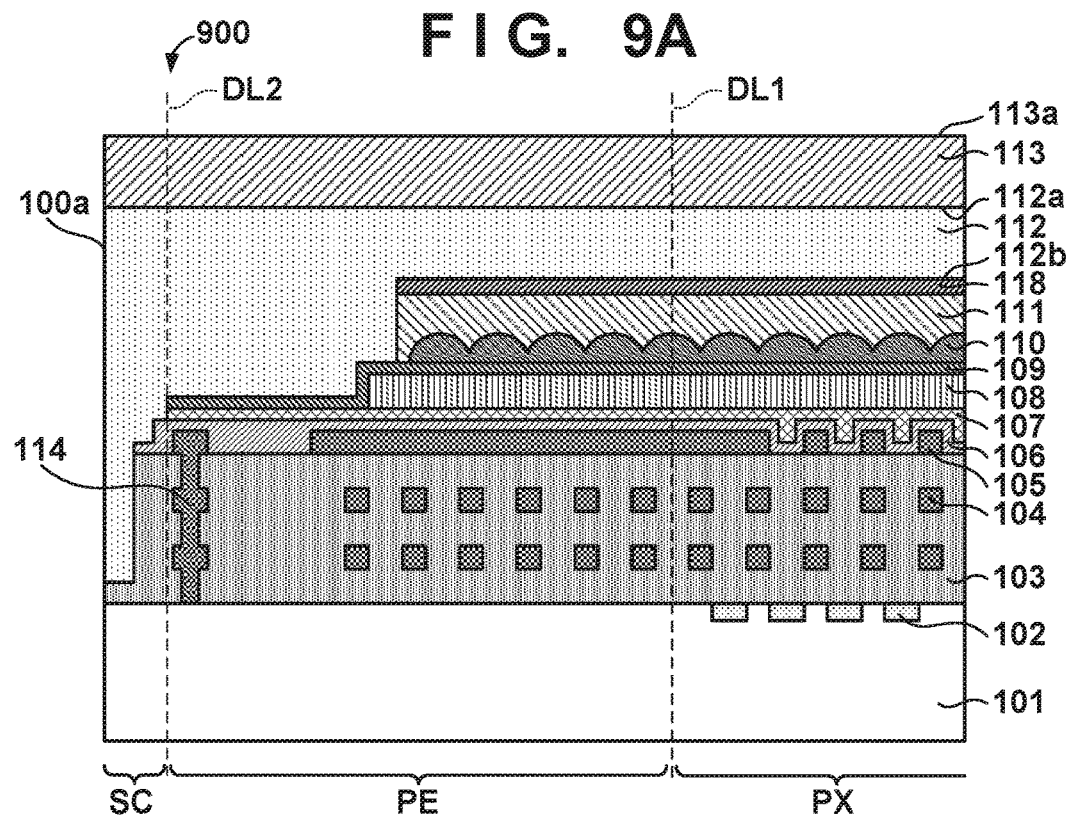
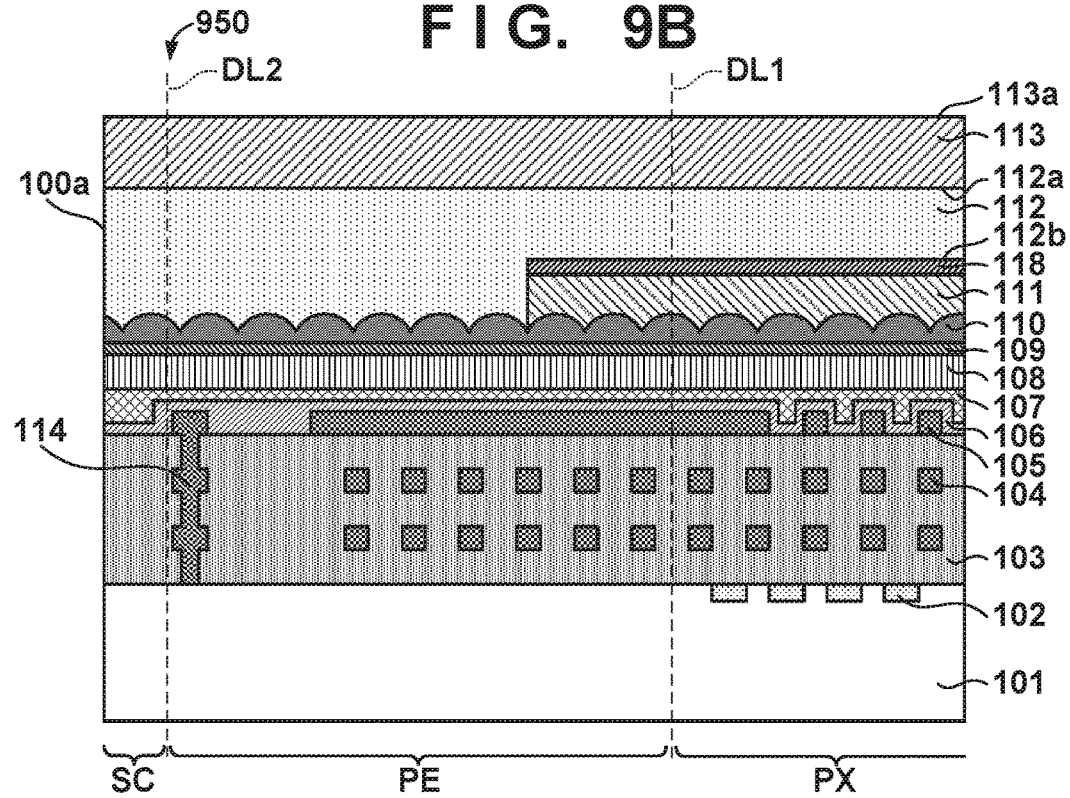

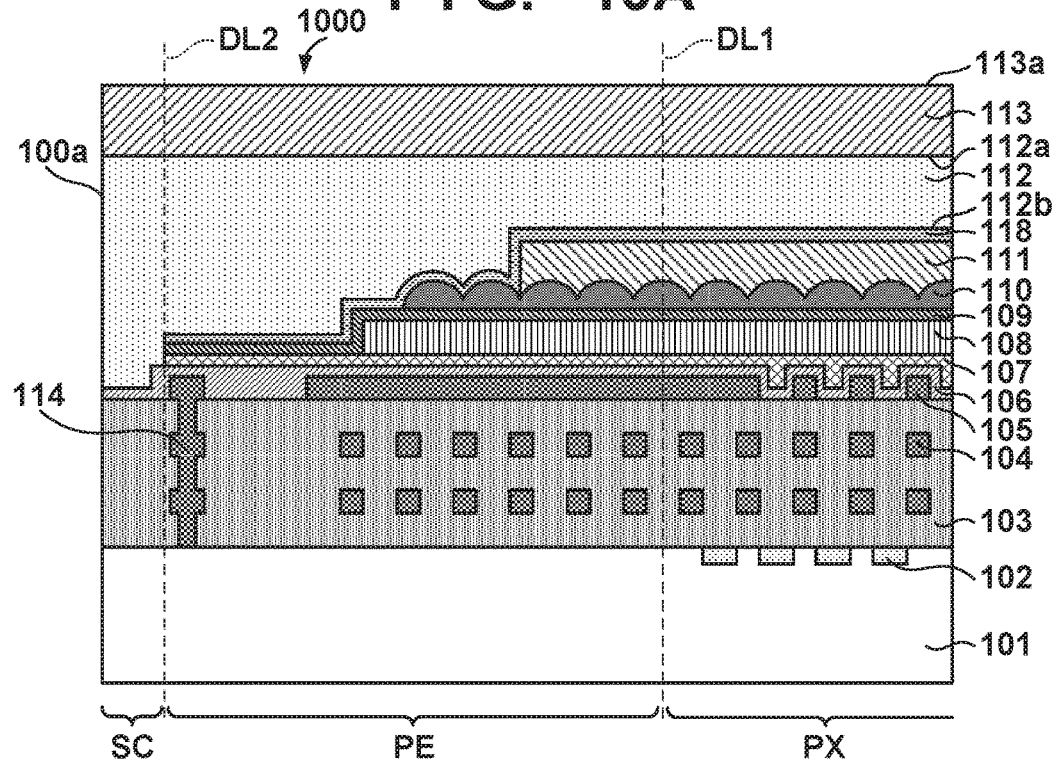
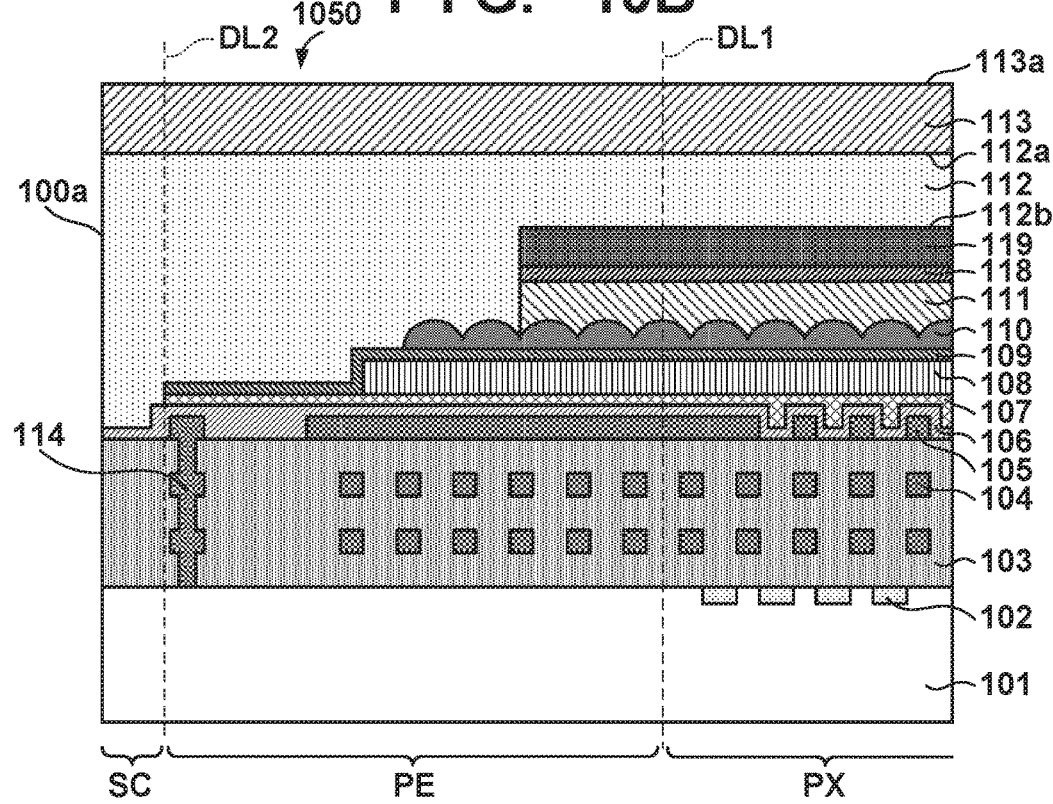

PHOTOELECTRIC CONVERSION APPARATUS AND SYSTEM

BACKGROUND OF THE INVENTION

Field of the Invention

The present invention is related to a photoelectric conversion apparatus and a system.

Description of the Related Art

Photoelectric conversion apparatuses in which a wafer level chip size package (WL-CSP) is used are broadly divided into those having a cavity structure and those having a fill structure. In a photoelectric conversion apparatus having a cavity structure, a photoelectric conversion substrate and a light transmissive plate are bonded to each other by a ring-shaped bonding member, and there is a void between a microlens array of the photoelectric conversion substrate and the light transmissive plate. Regarding a photoelectric conversion apparatus having a fill structure, the entire top surface of the photoelectric conversion substrate and a light transmissive plate are mutually bonded by a bonding member. Although a photoelectric conversion apparatus having the fill structure is superior in structural strength compared to a photoelectric conversion apparatus having the cavity structure, it is inferior in microlens power because the microlens array is covered by the bonding member whose refractive index is higher than that of air. Accordingly, in Japanese Patent Laid-Open No. 2015-159275, a photoelectric conversion substrate and a light transmissive plate are mutually bonded by a bonding member after a top surface of a microlens array is covered by a low-refractive index member whose refractive index is lower than the bonding member.

SUMMARY OF THE INVENTION

In a structure of Japanese Patent Laid-Open No. 2015-159275, since the reflectance at the boundary between the low-refractive index member and the bonding member is large, there is a possibility that a color heterogeneity that is due to the reflection will arise. An aspect of the present invention is to provide a technique for reducing color heterogeneity in a photoelectric conversion apparatus.

According to some embodiments, a photoelectric conversion apparatus comprises: a photoelectric conversion substrate having a plurality of photoelectric conversion portions and a microlens array arranged above the plurality of photoelectric conversion portions; a light transmissive plate; a first member arranged between the photoelectric conversion substrate and the light transmissive plate; a second member arranged between the first member and the microlens array; and a third member arranged between the first member and the second member, wherein a porosity of the first member<a porosity of the third member<a porosity of the second member is satisfied is provided.

Further features of the present invention will become apparent from the following description of exemplary embodiments (with reference to the attached drawings).

BRIEF DESCRIPTION OF THE DRAWINGS

FIGS. 2A and 2B are views for describing an example of a structure of the photoelectric conversion apparatus in some embodiments.

FIGS. 8A and 8B are views for describing another example of a structure of a photoelectric conversion apparatus in some embodiments.

FIGS. 9A and 9B are views for describing another example of a structure of a photoelectric conversion apparatus in some embodiments.

FIGS. 10A and 10B are views for describing another example of a structure of a photoelectric conversion apparatus in some embodiments.

DESCRIPTION OF THE EMBODIMENTS

Figure 1A:
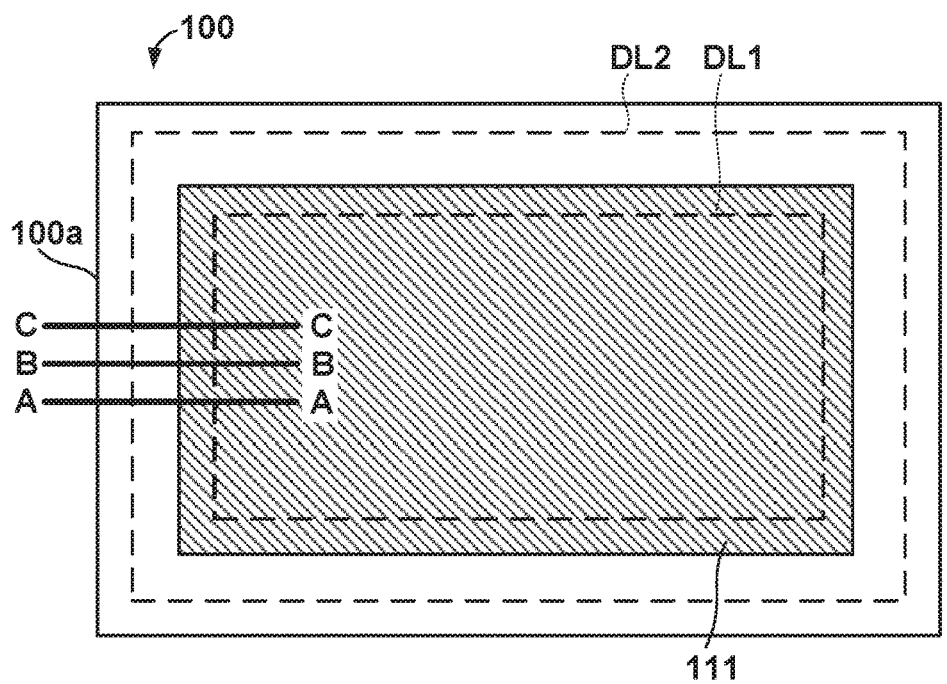
FIGS. 1A and 1B are views for describing an example of a structure of a photoelectric conversion apparatus in some embodiments.

Description is given regarding embodiments of the present invention while referencing attached drawings. The same reference numerals are given to similar elements throughout the various embodiments so duplicate descriptions are omitted. In addition, it is possible to appropriately change and combine each embodiment. In the attached drawings, the scale of each element may be different from that of an actual apparatus in order to simplify comprehension of the described element. Although description is given regarding a front-side illumination photoelectric conversion apparatus below, it is possible to similarly apply the present invention to a back-side illumination photoelectric conversion apparatus. The photoelectric conversion apparatus may also be referred to as a solid-state image capturing apparatus in a case where it is used for forming an image.

Description is given regarding one example of a structure of a photoelectric conversion apparatus 100 according to some embodiments of the present invention with reference to FIG. 1A to FIG. 3B. FIG. 1A is a plan view of the photoelectric conversion apparatus 100, FIG. 1B is a cross-sectional view in the AA line of FIG. 1A, FIG. 2A is a cross-sectional view in the BB line of FIG. 1A, and FIG. 2B is a cross-sectional view in the CC line of FIG. 1A. The photoelectric conversion apparatus 100 is a photoelectric conversion apparatus of a wafer level chip size package. Specifically, the photoelectric conversion apparatus 100 is obtained by, after forming configuration elements of a plurality of photoelectric conversion apparatuses on a semiconductor wafer, dicing the semiconductor wafer to separate the photoelectric conversion apparatuses as described in a method for manufacturing described later.

The photoelectric conversion apparatus 100 has a pixel region PX inside of a dashed line DL1, has a peripheral region PE between the dashed line DL1 and a dashed line DL2, and has a scribe region SC outside of the dashed line DL2 as illustrated in FIG. 1A. The pixel region PX is a region in which a plurality of pixels that convert an incident light to a signal charge are arranged in an array. The peripheral region PE is a region in which a circuit for reading a signal charge accumulated in a pixel or a circuit for driving the pixel is arranged. The scribe region SC is a region which is a target of the dicing in the process for manufacturing of the photoelectric conversion apparatus 100, and a circuit used in an operation of the photoelectric conversion apparatus 100 is not arranged in the scribe region SC. In FIG. 1A, only the dashed lines DL1 and DL2 which illustrate a boundary of each region, and a low-refractive index member 111 are illustrated in order to simplify comprehension of the drawing.

Figure 1B:
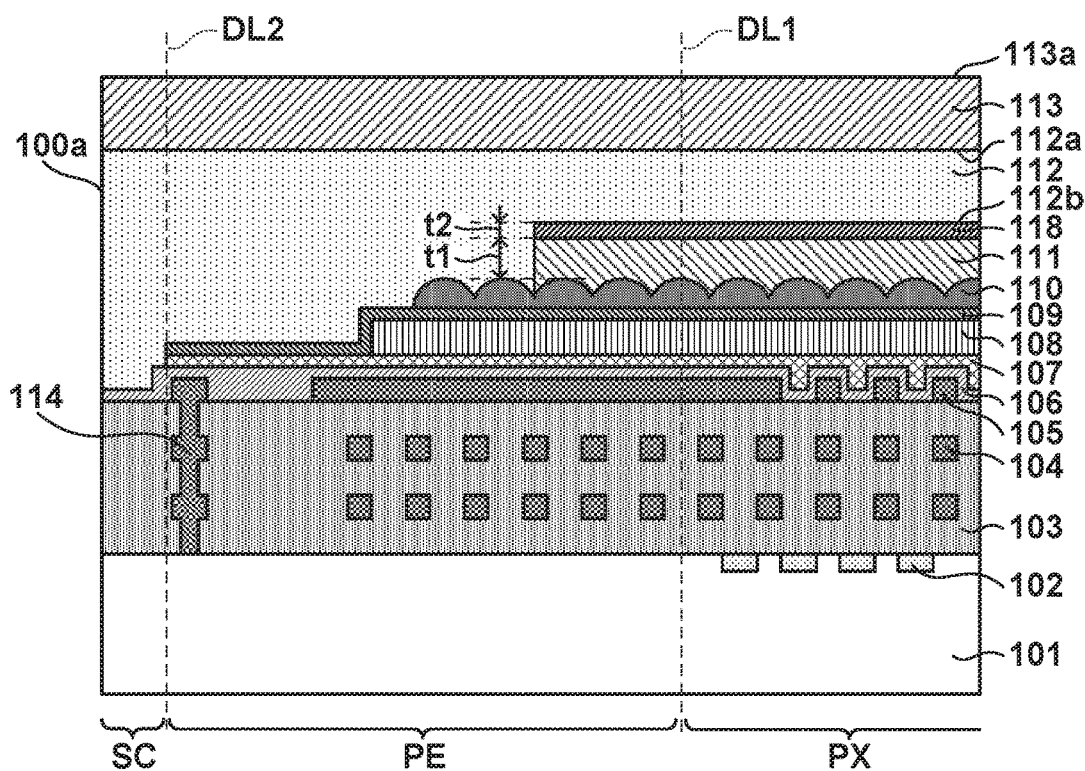

Description is given regarding a cross-sectional structure of the photoelectric conversion apparatus 100 with reference to FIG. 1B. The cross-sectional view of FIG. 1B focuses on a section from a part of the pixel region PX, exceeding a side surface 100a of the photoelectric conversion apparatus 100, and until the outside of the photoelectric conversion apparatus 100. In FIG. 1B, although description is given regarding one side surface 100a (left side surface in FIG. 1A) of the photoelectric conversion apparatus 100, the photoelectric conversion apparatus 100 has the same cross-sectional structure at its other outer surfaces.

The photoelectric conversion apparatus 100 has a semiconductor layer 101. The semiconductor layer 101 is a silicon layer for example. In the pixel region PX, a plurality of photoelectric conversion portions 102 are arranged in an array in the semiconductor layer 101. Each of the plurality of the photoelectric conversion portions 102 configure a part of a pixel. Description of other elements of a pixel such as a transistor is omitted because they are well known.

The photoelectric conversion apparatus 100 further has an insulating layer 103 on top of the semiconductor layer 101. The photoelectric conversion apparatus 100 further has a wiring layer 104 formed inside of the insulating layer 103 and a wiring layer 105 formed on top of the insulating layer 103. For this reason, the insulating layer 103 may be referred to as an interlayer insulation layer. The wiring layers 104 and 105 are configured by an electrically conductive member and transfer an electrical signal. Although there are two layers of the wiring layer 104 in the example of FIG. 1B, the number of layers of the wiring layer 104 is not limited to this. The wiring layers 104 and 105 are arranged in the pixel region PX and the peripheral region PE. The photoelectric conversion apparatus 100 further has a ring shaped moisture-proof ring 114 protruding from the top side of the insulating layer 103 formed inside of the insulating layer 103 in the peripheral region PE. The moisture-proof ring 114 entirely surrounds the periphery of the wiring layers 104 and 105. The moisture-proof ring 114 may be formed by the same material as the wiring layer 104.

The photoelectric conversion apparatus 100 further has a passivation film 106 on top of the insulating layer 103 and the wiring layer 105. The passivation film 106 is arranged across the entirety of the photoelectric conversion apparatus 100. Specifically, an edge of the passivation film 106 extends until the side surface 100a of the photoelectric conversion apparatus 100. The top surface of the passivation film 106 has an unevenness in accordance with a pattern of the wiring layer 105 in the example of FIG. 1B. Instead of this, the top surface of the passivation film 106 may be flat compared to the unevenness in accordance with the pattern of the wiring layer 105.

The photoelectric conversion apparatus 100 further has a planarizing layer 107 on top of the passivation film 106. The planarizing layer 107 is a resin layer formed by a resin for example. The top surface of the planarizing layer 107 is flat compared to the bottom surface. Below, not limited to the planarizing layer 107, planarizing layer means a layer whose top surface is flat compared to the bottom surface. The planarizing layer 107 is arranged across the entirety of the pixel region PX and the peripheral region PE, and is not arranged in the scribe region SC. In the example of FIG. 1B, the edge of the planarizing layer 107 extends until the boundary (dashed line DL2) of the peripheral region PE and the scribe region SC. Alternatively, the edge of the planarizing layer 107 may extend until part way through the peripheral region PE.

The photoelectric conversion apparatus 100 further has a color filter layer 108 on top of the planarizing layer 107. The color filter layer 108 is formed by a resin for example. A plurality of color filters corresponding to the plurality of pixels are formed in the color filter layer 108. The plurality of color filters are arranged in a Bayer arrangement for example. The top surface of the color filter layer 108 has an unevenness because the height differs for each color filter. The color filter layer 108 is arranged across the entirety of the pixel region PX and to part way through the peripheral region PE, and is not arranged in the scribe region SC. Specifically, the edge of the color filter layer 108 extends until part way through the peripheral region PE.

The photoelectric conversion apparatus 100 further has a planarizing layer 109 on top of the planarizing layer 107 and the color filter layer 108. The planarizing layer 109 is a resin layer formed by a resin for example. The portion on top of the color filter layer 108 in the top surface of the planarizing layer 109 is flat compared to the unevenness according to the color filter layer 108, and the portion outside of the color filter layer 108 in the top surface of the planarizing layer 109 is also flat compared to the unevenness according to the color filter layer 108. The portion of the top surface of the planarizing layer 109 on top of the color filter layer 108 and the portion that is outside are at different heights from the semiconductor layer 101. The planarizing layer 109 is arranged across the entirety of the pixel region PX and the peripheral region PE, and is not arranged in the scribe region SC. In the example of FIG. 1B, the edge of the planarizing layer 109 extends until the boundary (dashed line DL2) of the peripheral region PE and the scribe region SC. Alternatively, the edge of the planarizing layer 109 may extend until part way through of the peripheral region PE. In the example of FIG. 1B, the edge of the planarizing layer 107 and the edge of the planarizing layer 109 extend until the same position. Configuration may be taken such that the photoelectric conversion apparatus 100 does not have the color filter layer 108 or the planarizing layer 109 in a case where an identification of colors is not necessary in the photoelectric conversion apparatus 100.

The photoelectric conversion apparatus 100 further has a microlens array 110 on top of the planarizing layer 109. The microlens array 110 is formed by a resin for example. The microlens array 110 may be formed by an organic material and may be formed by an inorganic material. The microlens array 110 is a group of a plurality of microlenses arranged in an array. The plurality of microlenses are arranged corresponding to the plurality of photoelectric conversion portions 102 and the top surface of each microlens is a convex curve. The microlens array 110 is arranged across the entirety of the pixel region PX and to part way through the peripheral region PE, and is not arranged in the scribe region SC. The microlens array 110 may be formed by the same material as the planarizing layer 109 or may be formed by a different material. The edge of the microlens array 110 is positioned further inside (a side farther from the side surface 100a) than the edge of the color filter layer 108.

The photoelectric conversion apparatus 100 further has the low-refractive index member 111 on top of the microlens array 110, and has a medium-refractive index member 118 on top of the low-refractive index member 111. The low-refractive index member 111 and the medium-refractive index member 118 are arranged across the entirety of the pixel region PX and part way through the peripheral region PE, and are not arranged in the scribe region SC. The edges of the low-refractive index member 111 and the medium-refractive index member 118 are positioned further inside (a side farther from the side surface 100a) than the edge of the microlens array 110. In this way, the low-refractive index member 111 and the medium-refractive index member 118 cover a part of the microlens array 110. The side surface of the low-refractive index member 111 and the side surface of the medium-refractive index member 118 are flush with each other. On top of the plurality of photoelectric conversion portions 102, both the top surface of the low-refractive index member 111 and the top surface of the medium-refractive index member 118 are flat compared to the unevenness according to the microlenses 110a. Also, on top of the plurality of photoelectric conversion portions 102, the low-refractive index member 111 contacts the microlens array 110 and the medium-refractive index member 118 contacts the low-refractive index member 111. Above the apex of the microlenses included in the microlens array 110, a thickness t2 of the medium-refractive index member 118 is smaller than a thickness t1 of the low-refractive index member 111. For example, the thickness t1 of the portion on top of the apex of the microlenses in the low-refractive index member 111 may be 2.0 μm or more, and may be 5.0 μm or less, and may be 2.0 μm or less. The thickness t2 of the medium-refractive index member 118 may be constant across the entire region, and may be 50 nm or more, for example, and 150 nm or less, for example, and may be 97 nm, for example.

A structure formed from the above described semiconductor layer 101 to the microlens array 110 is referred to as a photoelectric conversion substrate. The photoelectric conversion apparatus 100 further has the low-refractive index member 111, the medium-refractive index member 118, a bonding member 112, and a light transmissive plate 113.

The light transmissive plate 113 is a plate-shaped member through which light passes and is formed by glass, for example. The light transmissive plate 113 may have a strength such that it protects the photoelectric conversion substrate. The top surface 113a of the light transmissive plate 113 is a light-receiving surface that receives light incident on the photoelectric conversion apparatus 100. Light that entered from the top surface 113a is converted into an electrical signal by the photoelectric conversion substrate.

The bonding member 112 is arranged between the photoelectric conversion substrate and the light transmissive plate 113, and mutually bonds the photoelectric conversion substrate and the light transmissive plate 113. The low-refractive index member 111 is arranged between the bonding member 112 and the microlens array 110. The medium-refractive index member 118 is arranged between the bonding member 112 and the low-refractive index member 111. The bonding member 112 is formed by curing an adhesive agent as described in the method for manufacturing described later. For this reason, the bonding member 112 is a member configured by a single material. An organic material which becomes transparent after being cured, an acrylic epoxy for example, may be used as the adhesive agent material.

The side surface of the bonding member 112 configures a part of the side surface 100a of the photoelectric conversion apparatus 100. The top surface 112a of the bonding member 112 (that it, the surface on the side of the light transmissive plate 113) contacts and is bonded with the light transmissive plate 113. Accordingly, the top surface 112a of the bonding member 112 can be referred to as a contact surface or a bonding surface. The top surface 112a extends until the side surface 100a of the photoelectric conversion apparatus 100 and the entire surface of the top surface 112a is bonded to the light transmissive plate 113. The top surface 112a is flat because the light transmissive plate 113 is a plate-shaped member.

The bottom surface 112b of the bonding member 112 (that is, the surface of the side of the photoelectric conversion substrate) contacts and is bonded with the photoelectric conversion substrate and the low-refractive index member 111. Accordingly, the bottom surface 112b of the bonding member 112 can be referred to as a contact surface or a bonding surface. The top surface 112a and the bottom surface 112b are at opposite sides to each other. The bottom surface 112b extends until the side surface 100a of the photoelectric conversion apparatus 100 and is bonded to the photoelectric conversion substrate in the proximity of the outer circumference of the bottom surface 112b. Specifically, the bottom surface 112b contacts and is bonded with the top surface and the side surface of the low-refractive index member 111 and the portion of the top surface of the microlens array 110 not covered by the low-refractive index member 111. The bottom surface 112b further contacts and is bonded with the portion of the top surface of the planarizing layer 109 not covered by the microlens array 110, the edge of the planarizing layer 107, and a portion of the passivation film 106 not covered by the planarizing layer 107.

By the respective refractive indexes of the low-refractive index member 111, the medium-refractive index member 118, and the bonding member 112 satisfying the following relationship, an optical characteristic as typified by color heterogeneity can be improved.

The refractive index of the bonding member 112>the refractive index of the medium-refractive index member 118>the refractive index of the low-refractive index member 111     (Equation 1)

Configuration may be such that the respective refractive indexes of the microlens array 110, the low-refractive index member 111, the medium-refractive index member 118, and the bonding member 112 satisfy the following relationship:

The refractive index of the microlens array 110>the refractive index of the bonding member 112>the refractive index of the medium-refractive index member 118>the refractive index of the low-refractive index member 111     (Equation 1a)

For example, in relation to light of a wavelength of 550 nm, the refractive index of the microlens array 110 is 1.87, the refractive index of the bonding member 112 is 1.55, the refractive index of the medium-refractive index member 118 is 1.33, and the refractive index of the low-refractive index member 111 is 1.22. Furthermore, the refractive index of the low-refractive index member 111 may be 1.15 or more and may be 1.30 or less. The refractive index of the microlens array 110 may be 1.50 or more and may be 1.90 or less. If the microlens array 110 is formed by a single member, the refractive index of the member is the refractive index of the microlens array 110. In a case where the microlens array 110 has a stacked structure and each layer is formed by a different material, the refractive index of the layer closest to the low-refractive index member 111 may be made to be the refractive index of the microlens array 110.

Configuration may be such that the respective refractive indexes of the microlens array 110, the low-refractive index member 111, the medium-refractive index member 118, and the bonding member 112 satisfy the following relationship:

The refractive index of the bonding member 112>the refractive index of the microlens array 110>the refractive index of the medium-refractive index member 118>the refractive index of the low-refractive index member 111  (Equation 1b)

Typically, the porosity and the refractive index of a member whose principal component is the same material have a negative correlation. The porosity may be defined as a ratio of a volume that a portion of air occupies out of the whole. It is also possible that the porosity be measured as a ratio of an area that a portion of a void occupies out of the whole in a cross-sectional view. In one example of a specific measurement method for a porosity, an electron microscope photograph of a cross section of a measurement target is obtained, binarization processing for voids and solid portions is performed by image processing, and the area of the voids corresponding to a unit area is made to be the porosity. Accordingly, by the porosities of each of the microlens array 110, the low-refractive index member 111, the medium-refractive index member 118, and the bonding member 112 satisfying the following relationship, the optical characteristic and the mechanical characteristic can be improved.

The porosity of the bonding member 112<the porosity of the medium-refractive index member 118<the porosity of the low-refractive index member 111  (Equation 2)

The photoelectric conversion apparatus 100 may satisfy at least one of Equation 1 and Equation 2. The porosity of the low-refractive index member 111 may be 40% or more and may be 60% or less, for example. The porosity of the medium-refractive index member 118 may be 20% or more and may be 40% or less, for example. The porosity of the bonding member 112 may be 20% or more and may be 30% or less, for example. The porosity of the microlens array 110 may be 0% or more and may be 20% or less, for example. The porosity of the microlens array 110 may be 0%.

Configuration may be such that the porosities of the microlens array 110, the medium-refractive index member 118, and the bonding member 112 satisfy the following relationship:

The porosity of the microlens array 110≠the porosity of the medium-refractive index member 118  (Equation 2a)

The porosity of the microlens array 110<the porosity of the bonding member 112  (Equation 2b)

Furthermore, the low-refractive index member 111 and the medium-refractive index member 118 may satisfy the following relationship:

The film density of the medium-refractive index member 118>the film density of the low-refractive index member 111  (Equation 3)

For example, the film density of the low-refractive index member 111 may be 0.1 g/cm³ or more and may be 1.0 g/cm³ or less. The film density of the medium-refractive index member 118 may be 1.0 g/cm³ or more and may be 10 g/cm³ or less.

Next, description is given regarding another cross-sectional structure of the photoelectric conversion apparatus 100 with reference to FIG. 2A. FIG. 2A is a cross section at a different position than FIG. 1B, and illustrates a cross section through an electrode 116. The cross-sectional view of FIG. 2A focuses on a section from a part of the pixel region PX, exceeding a side surface 100a of the photoelectric conversion apparatus 100, and until the outside of the photoelectric conversion apparatus 100. In FIG. 2A, although description is given regarding one side surface 100a (left side surface in FIG. 1A) of the photoelectric conversion apparatus 100, the photoelectric conversion apparatus 100 has the same cross-sectional structure at its other side surfaces.

A through hole 115 is formed in the semiconductor layer 101 and the insulating layer 103 as illustrated in FIG. 2A. One end of the through hole 115 reaches a portion 105a of the wiring layer 105. The photoelectric conversion apparatus 100 further has the electrode 116 which passes through the through hole 115. A part of the electrode 116 contacts and is bonded with the portion 105a of the wiring layer 105, and another portion 116a of the electrode 116 extends parallel to the bottom surface of the semiconductor layer 101 (specifically, the surface on the side opposite to the light transmissive plate 113). A solder bump 117 for soldering the photoelectric conversion apparatus 100 to a mounting board is provided on the portion 116a of the electrode 116. The portion 116a of the electrode 116 and the low-refractive index member 111 and the medium-refractive index member 118 are arranged to have a space W between them in the plan view in relation to the top surface 113a of the light transmissive plate 113. Due to such an arrangement, it is possible to reduce a force on the low-refractive index member 111 and the medium-refractive index member 118 when soldering the photoelectric conversion apparatus 100 to the mounting board. This arrangement is advantageous in a case where the structural strength of the low-refractive index member 111 and the medium-refractive index member 118 is low.

Next, description is given regarding another cross-sectional structure of the photoelectric conversion apparatus 100 with reference to FIG. 2B. FIG. 2B is a cross section at a different position than FIG. 1B, and illustrates a cross section through a pad for inspection. The cross-sectional view of FIG. 2B focuses on a section from a part of the pixel region PX, exceeding a side surface 100a of the photoelectric conversion apparatus 100, and until the outside of the photoelectric conversion apparatus 100. In FIG. 2B, although description is given regarding one side surface 100a (left side surface in FIG. 1A) of the photoelectric conversion apparatus 100, the photoelectric conversion apparatus 100 may have the same cross-sectional structure at another side surface.

The passivation film 106, the planarizing layer 107, and the planarizing layer 109 are removed from the top of the portion 105b of the wiring layer 105. The portion 105b of the wiring layer 105 is positioned at the peripheral region PE. The portion 105b of the wiring layer 105 functions as a pad for inspecting the photoelectric conversion substrate during manufacturing of the photoelectric conversion apparatus 100. The bottom surface 112b of the bonding member 112 also contacts and is bonded with the portion 105b of the wiring layer 105.

Figure 3A:
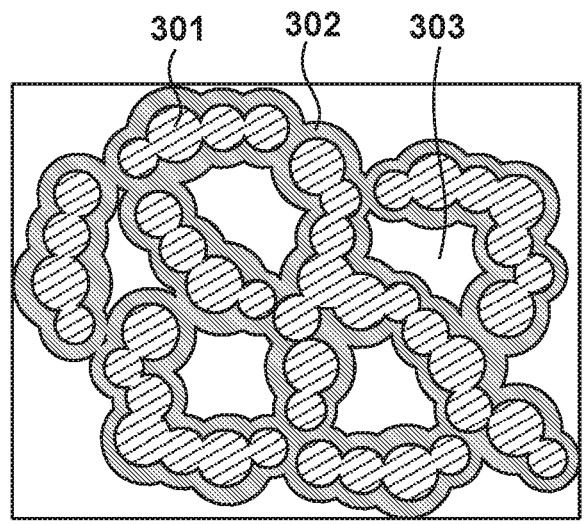
FIGS. 3A and 3B are views for describing an example of materials of a low-refractive index member in some embodiments.

Next, an example of a material of the low-refractive index member 111 is described with reference to FIGS. 3A and 3B.

The medium-refractive index member 118 is formed by a similar material to the low-refractive index member 111 explained below. In the example illustrated in FIG. 3A, the low-refractive index member 111 is formed by a plurality of chain fillers 301 and a binder 302 (bonding agent) which bonds the plurality of chain fillers 301. Each of the plurality of chain fillers 301 may include a solid silica particle for example. The binder is a polysiloxane or an acrylic resin for example. Each chain filler 301 is enveloped in the binder 302. A structure in which the chains of the plurality of chain fillers 301 are sterically bonded is formed by bonding the plurality of chain fillers 301 to each other by the binder 302. For this reason, the low-refractive index member 111 has voids 303 between the plurality of the chain fillers 301.

Figure 3B:
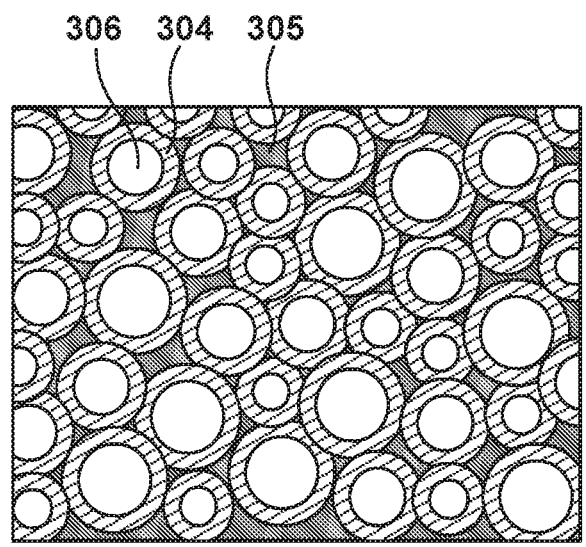

In the example illustrated in FIG. 3B, the low-refractive index member 111 is formed by a plurality of granular fillers 304 and a binder 305 (bonding agent) which bonds the plurality of granular fillers 304. Each of the plurality of granular fillers 304 has a hollow structure including a void 306 inside and may include a hollow silica particle for example. The binder is polysiloxane or an acrylic resin for example.

Furthermore, the low-refractive index member 111 and the medium-refractive index member 118 may both have the same structure, or may have different structures. For example, the low-refractive index member 111 and the medium-refractive index member 118 may both have the structure of FIG. 3A or FIG. 3B. Instead of that, configuration may be taken such that the low-refractive index member 111 has the structure of either FIG. 3A or FIG. 3B, and the medium-refractive index member 118 has the structure of the other of FIG. 3A or FIG. 3B. The respective porosities of the low-refractive index member 111 and the medium-refractive index member 118 can be set by adjusting the ratios that the voids 303 and 306 occupy. Even if the material of either of the examples of FIGS. 3A and 3B are used, it is possible to make the porosities larger than that of the microlens array 110 because the low-refractive index member 111 and the medium-refractive index member 118 are structures including the voids 303 and 306.

As described above, in the photoelectric conversion apparatus 100, because at least one of Equation 1 and Equation 2 is satisfied, it is possible to have the following effects. Firstly, it is possible to reduce first-order reflection in the top surface of the low-refractive index member 111 and second-order reflection in the top surface of the microlens array 110. For this reason, a color heterogeneity in the photoelectric conversion apparatus 100 is reduced. Also, because it is possible to make the low-refractive index member 111 into a thin film, it is possible to suppress the occurrence of cracks in the photoelectric conversion apparatus 100. Furthermore, by arranging the medium-refractive index member 118 between the low-refractive index member 111 and the bonding member 112, stress between the low-refractive index member 111 and the bonding member 112 is alleviated, and as a result it is possible to suppress cracks and film peeling in the photoelectric conversion apparatus 100. Furthermore, the bottom surface 112b of the bonding member 112 contacts a portion of the top surface of the microlens array 110 and a portion of the top surface of the planarizing layer 109 and bonds to them, and thereby it is possible to reduce the ratio of the bonding area with the medium-refractive index member 118 where the bonding strength is relatively weak. Furthermore, a part of the photoelectric conversion substrate (the microlens array 110 for example) is formed by an organic material, and an improvement in adhesion due to a polar group such as an OH group or a COOH group in a case where the bottom surface 112b of the bonding member 112 contacts and is bonded with a portion of the organic material is achieved. Peeling or cracking due to moisture absorption, shock, and temperature change at a time of using the photoelectric conversion apparatus 100 can be suppressed by improving the bond between the bonding member 112 and the photoelectric conversion substrate.

Figure 4A:
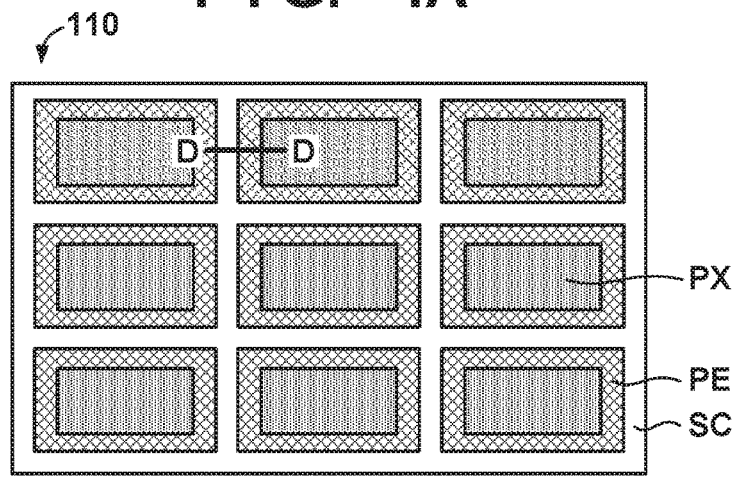
FIGS. 4A-4C are views for describing an example of a method for manufacturing a photoelectric conversion apparatus in some embodiments.
Figure 4B:
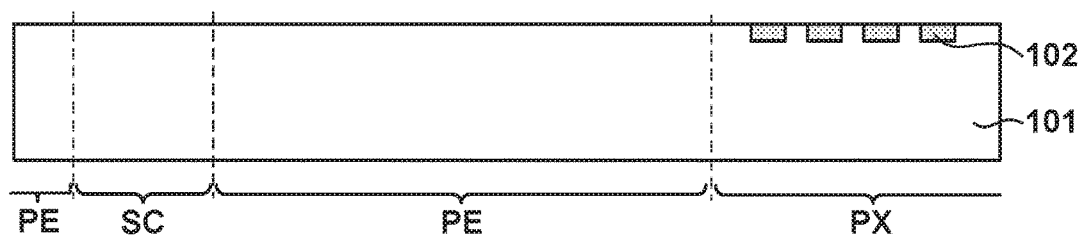

Next, a description is given regarding a method for manufacturing of the photoelectric conversion apparatus 100 with reference to FIG. 4A to FIG. 6B. Firstly, the semiconductor layer 101 as illustrated in FIGS. 4A and 4B is prepared. FIG. 4A illustrates a plan view of the semiconductor layer 101, and FIG. 4B illustrates a cross-sectional view in a DD line. The DD line of FIG. 4A is at a position corresponding to the CC line of FIG. 1A. A plurality of pairs of the pixel region PX and the peripheral region PE in the periphery thereof are arranged in 3 rows and 3 columns spaced apart on the semiconductor layer 101 as illustrated in FIG. 4A. An impurity region (the photoelectric conversion portion 102 for example) for configuring one photoelectric conversion apparatus 100 is formed for each pair of the pixel region PX and the peripheral region PE. A region outside of the peripheral region PE is the scribe region SC. The cross-sectional view of FIG. 4B focuses on a section from a part of one pixel region PX, exceeding the scribe region SC, and to a part of the peripheral region PE for forming another photoelectric conversion apparatus 100.

Figure 4C:
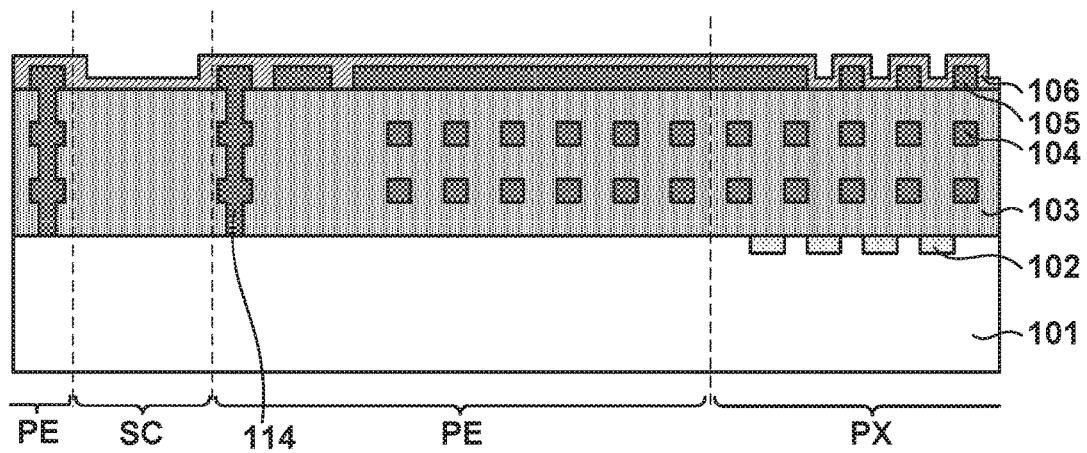
Figure 5A:
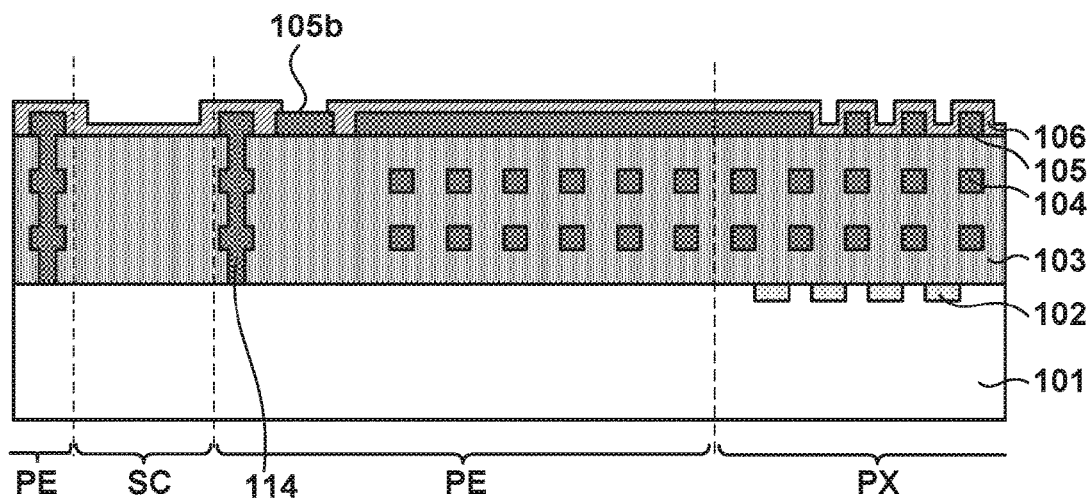
FIGS. 5A and 5B are views for describing an example of a method for manufacturing a photoelectric conversion apparatus in some embodiments.

Next, the insulating layer 103, the wiring layer 104, the wiring layer 105, the moisture-proof ring 114, and the passivation film 106 are formed on top of the semiconductor layer 101 as illustrated in FIG. 4C. A detailed description is omitted because a conventional technique is used in this step. Next, an opening is formed in the passivation film 106 so that the portion 105b of the wiring layer 105 is exposed as illustrated in FIG. 5A. As described above, the portion 105b of the wiring layer 105 is used as a pad for inspection.

Figure 5B:
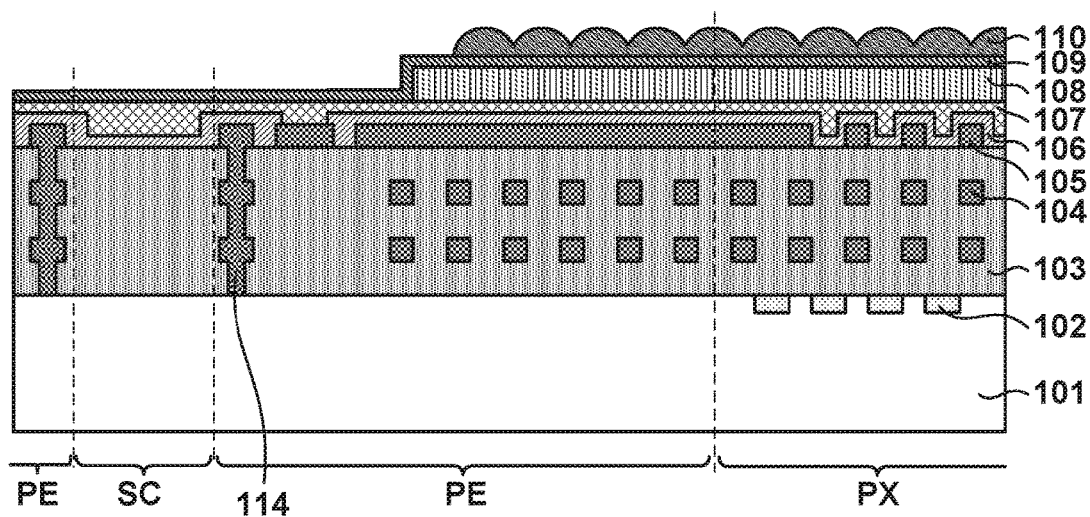

Next, the planarizing layer 107, the color filter layer 108, the planarizing layer 109, and the microlens array 110 are formed in this order on top of the passivation film 106 as illustrated in FIG. 5B. For example, the planarizing layer 107 and the planarizing layer 109 are respectively formed by baking after spin-coating with a resin material. The color filter layer 108 is formed by performing a photolithography step after applying an organic resin. The microlens array 110 is formed by performing a photolithography step or an etchback step after depositing an organic material or an inorganic material.

Figure 6A:
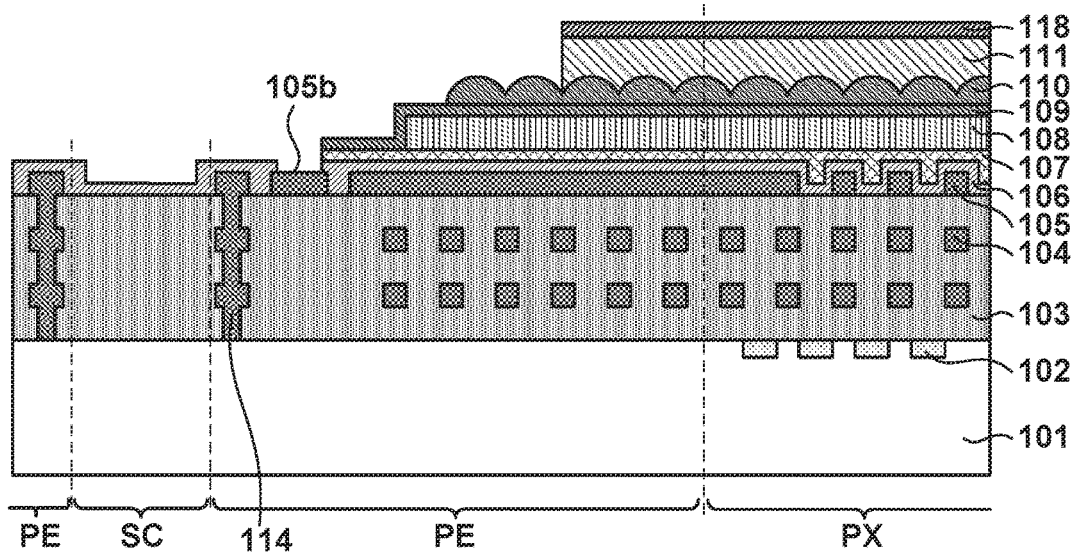
FIGS. 6A and 6B are views for describing an example of a method for manufacturing a photoelectric conversion apparatus in some embodiments.

Next, portions of the planarizing layer 107 and the planarizing layer 109 covering the scribe region SC and the portion 105b of the wiring layer 105 are removed as illustrated in FIG. 6A. In this step, the portions of the planarizing layer 107 and the planarizing layer 109 covering between the scribe region SC and the portion 105b of the wiring layer 105 may also be removed as illustrated in FIG. 6A. After that, the low-refractive index member 111 and the medium-refractive index member 118 are formed in this order. For example, the low-refractive index member 111 and the medium-refractive index member 118 is formed by a dry etching, a wet etching, a printing method, or the like. The low-refractive index member 111 and the medium-refractive index member 118 may be formed by a photolithography step in a case where the low-refractive index member 111 is formed by a photosensitive material. The photoelectric conversion substrate is formed by the foregoing steps.

Figure 6B:
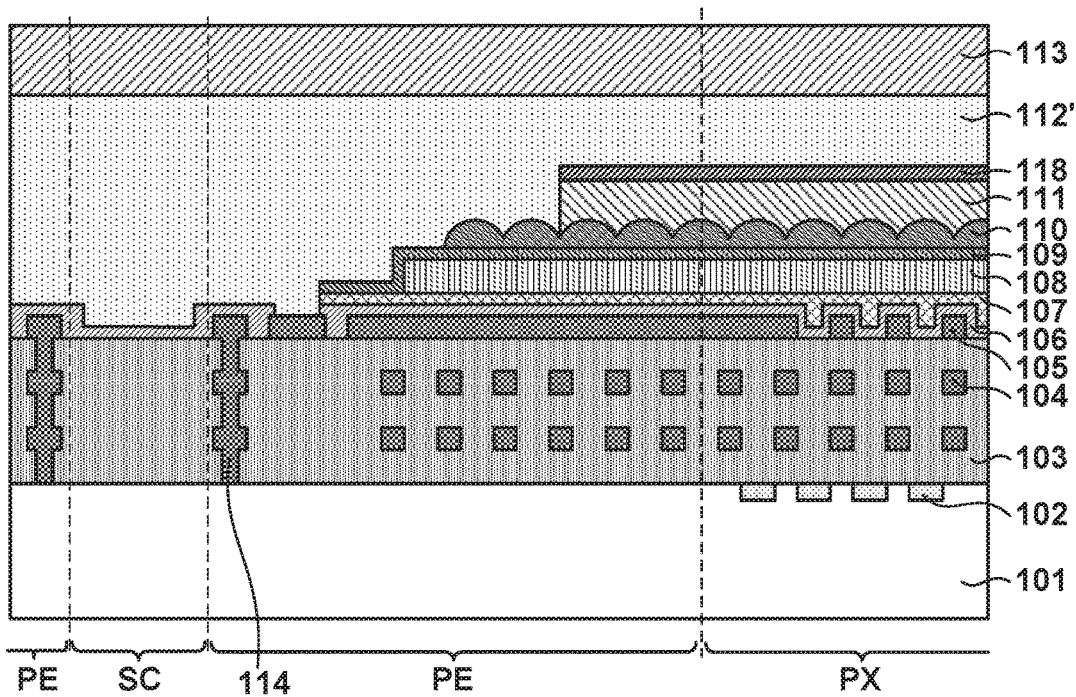

Next, the photoelectric conversion substrate formed by the foregoing steps and the light transmissive plate 113 which is prepared separately, are bonded together by an adhesive agent 112' and the adhesive agent 112' is caused to be cured after this as illustrated in FIG. 6B. The cured adhesive agent 112' is the bonding member 112. After this, in a process that is not shown graphically, the bottom surface of the semiconductor layer 101 is thinned by polishing the semiconductor layer 101. Then, the through hole 115 penetrating the semiconductor layer 101 and the insulating layer 103 is formed and the electrode 116 which passes through this through hole 115 is formed. Furthermore, a plurality (nine in this example) of photoelectric conversion apparatuses 100 are obtained by dicing the scribe region SC.

Next, description is given regarding various variations of the photoelectric conversion apparatus 100 with reference to FIG. 7A to FIG. 9B. A configuration illustrated in a variation, may be applied to only some of the side surfaces of the photoelectric conversion apparatus 100 and may be applied to all of the side surface. Also, the applied variation may be the same or may be different for each side surface of the photoelectric conversion apparatus 100. In the description below, description regarding the same configuration as in the photoelectric conversion apparatus 100 is omitted, and description regarding points of difference is given. Each drawing described below corresponds to the cross-sectional view of the photoelectric conversion apparatus 100 illustrated in FIG. 1B. There are also the same points of difference regarding the cross-sectional views illustrated in FIG. 2A and FIG. 2B.

Figure 7A:
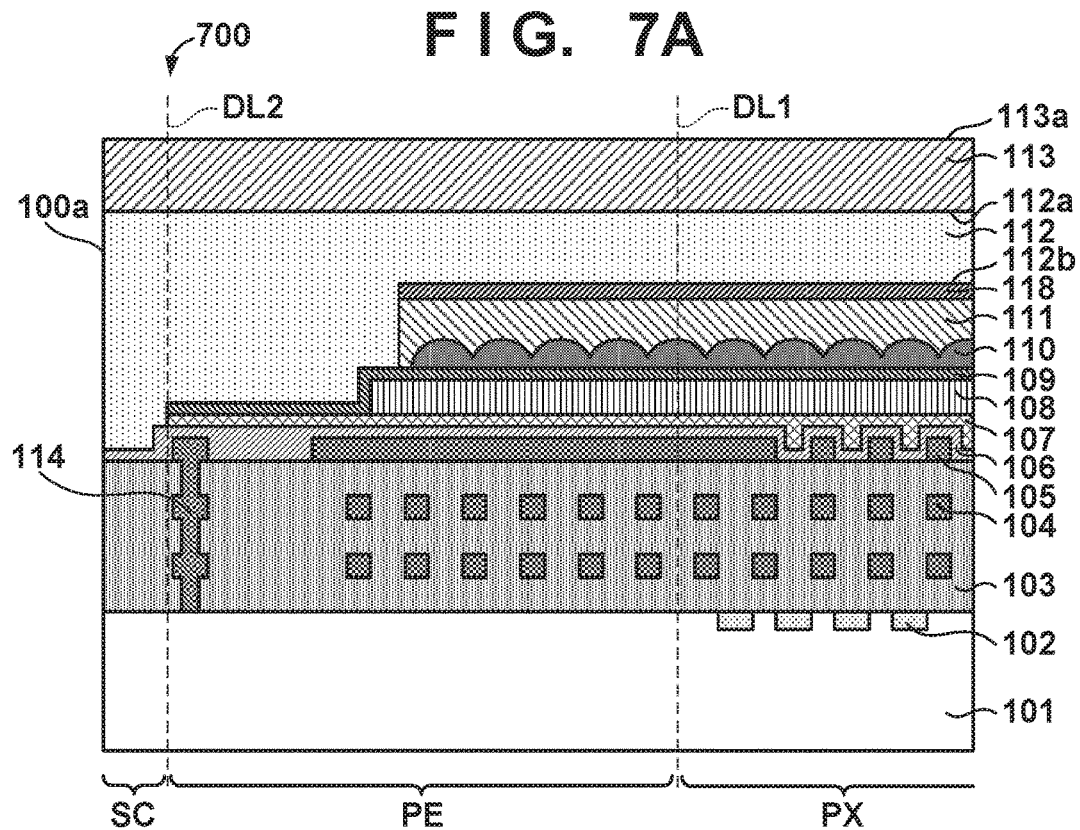
FIGS. 7A and 7B are views for describing another example of a structure of a photoelectric conversion apparatus in some embodiments.

In a photoelectric conversion apparatus 700 illustrated in FIG. 7A, the position of the edges of the low-refractive index member 111 and the medium-refractive index member 118 is different to in the photoelectric conversion apparatus 100. The low-refractive index member 111 and the medium-refractive index member 118 cover the entirety of the microlens array 110. The edges of the low-refractive index member 111 and the medium-refractive index member 118 are positioned between the edge of the microlens array 110 and the edge of the color filter layer 108 in the plan view for the top surface 113a of the light transmissive plate 113.

Figure 7B:
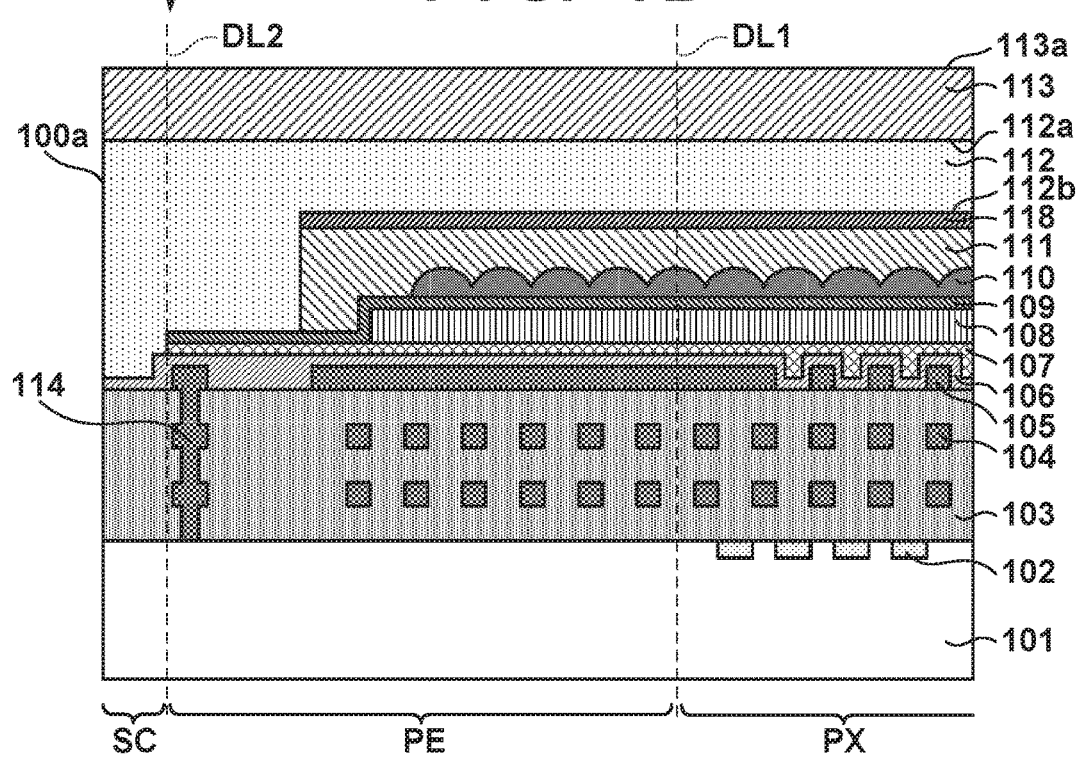

In a photoelectric conversion apparatus 750 illustrated in FIG. 7B, the position of the edges of the low-refractive index member 111 and the medium-refractive index member 118 is different to in the photoelectric conversion apparatus 100. The low-refractive index member 111 and the medium-refractive index member 118 cover the entirety of the microlens array 110. The edges of the low-refractive index member 111 and the medium-refractive index member 118 are positioned between the edge of the planarizing layer 109 and the edge of the color filter layer 108 in the plan view for the top surface 113a of the light transmissive plate 113.

In a photoelectric conversion apparatus 800 illustrated in FIG. 8A, there is a difference from the photoelectric conversion apparatus 100 in that there additionally is an intermediate film 801 which covers the entirety of the top surface of the microlens array 110. The intermediate film 801 is arranged between at least a part of the microlens array 110 and the low-refractive index member 111. The intermediate film 801 may be formed by a material that satisfies at least one of Equation 4 and Equation 5 below:

The refractive index of the microlens array 110>the refractive index of the intermediate film 801>the refractive index of the low-refractive index member 111 (Equation 4)

The porosity of the intermediate film 801<the porosity of the low-refractive index member 111 (Equation 5)

Furthermore, the intermediate film 801 may be formed by a material that satisfies at least one of Equation 6 and Equation 7 below:

The refractive index of the microlens array 110>the refractive index of the intermediate film 801>the refractive index of the medium-refractive index member 118 (Equation 6)

The porosity of the intermediate film 801<the porosity of the medium-refractive index member 118 (Equation 7)

For example, if the microlens array 110 is formed by silicon nitride (in relation to light whose wavelength is 550 nm, the refractive index is 1.87), the intermediate film 801 may be formed by silicon oxide (in relation to light whose wavelength is 550 nm, the refractive index is 1.47). The intermediate film 801 has a portion which extends from between the microlens array 110 and the low-refractive index member 111 to further to the outside than the edge of the low-refractive index member 111. This extending portion is positioned between the photoelectric conversion substrate and the bonding member 112. The intermediate film 801 extends until the edge of the planarizing layer 109 in one example, and the edge of the extending portion is separated from the side surface of the photoelectric conversion apparatus 800. The top surface of the portion covering the microlens array 110 in the intermediate film 801 is a curved surface shape similar to the top surface of the microlens array 110. Specifically, the top surface of the intermediate film 801 has a lens shape. That is, the top surface of the intermediate film 801 has an unevenness according to the unevenness of the lens array 110. For this reason, a combination of the microlens array 110 and a portion of the intermediate film 801 on the top of the microlens array 110 may be considered to be configuring a microlens array. The intermediate film 801 functions as a member that has various effects such as preventing reflection, improving adhesion, preventing contamination, and mitigating stress. The intermediate film 801 is an inorganic material film, for example.

In a photoelectric conversion apparatus 850 illustrated in FIG. 8B, there is a difference from the photoelectric conversion apparatus 100 in that there additionally is an intermediate film 851 which covers a part of the top surface of the microlens array 110. A material of the intermediate film 851 may be the same as the material of the intermediate film 801. The edge of the intermediate film 851 aligns with the edge of the low-refractive index member 111. For this reason, the top surface of the intermediate film 851 does not include a portion that contacts with the bottom surface 112b of the bonding member 112 because it is covered by the low-refractive index member 111.

In a photoelectric conversion apparatus 900 illustrated in FIG. 9A, there is a difference from the photoelectric conversion apparatus 100 in that the insulating layer 103 has a step at the scribe region SC. The bottom surface 112b of the bonding member 112 also contacts and is bonded with this step. The bonding member 112 does not contact with the semiconductor layer 101 because a part of the insulating layer 103 remains on a portion of the bottom of this step.

In a photoelectric conversion apparatus 950 illustrated in FIG. 9B, there is a difference from the photoelectric conversion apparatus 100 in that the planarizing layer 107, the color filter layer 108, the planarizing layer 109, and the microlens array 110 each extend until the side surface 100a of the photoelectric conversion apparatus 100. A portion of the microlens array 110 is not covered by the low-refractive index member 111. For this reason, the bottom surface 112b of the bonding member 112 contacts and is bonded with this portion of the microlens array 110.

In a photoelectric conversion apparatus 1000 illustrated in FIG. 10A, the edge of the medium-refractive index member 118 is different from that in the photoelectric conversion apparatus 100 in that it extends until the edge of the planarizing layer 109. As a result of this, the medium-refractive index member 118 covers the side surface of the low-refractive index member 111, a part of the microlens array 110, and a part of the planarizing layer 109, and contacts these. Instead of this, the edge of the medium-refractive index member 118 may be positioned somewhere between the edge of the low-refractive index member 111 and the edge of the planarizing layer 109.

A photoelectric conversion apparatus 1050 illustrated in FIG. 10B differs from the photoelectric conversion apparatus 100 in that it further comprises a mask layer 119 between the medium-refractive index member 118 and the bonding member 112. The mask layer 119 is used in etching to form the low-refractive index member 111 and the medium-refractive index member 118 in the foregoing FIG. 6A. After etching, the photoelectric conversion substrate and the light transmissive plate 113 are bonded by an adhesive agent 112' without removing the mask layer 119.

Figure 11:
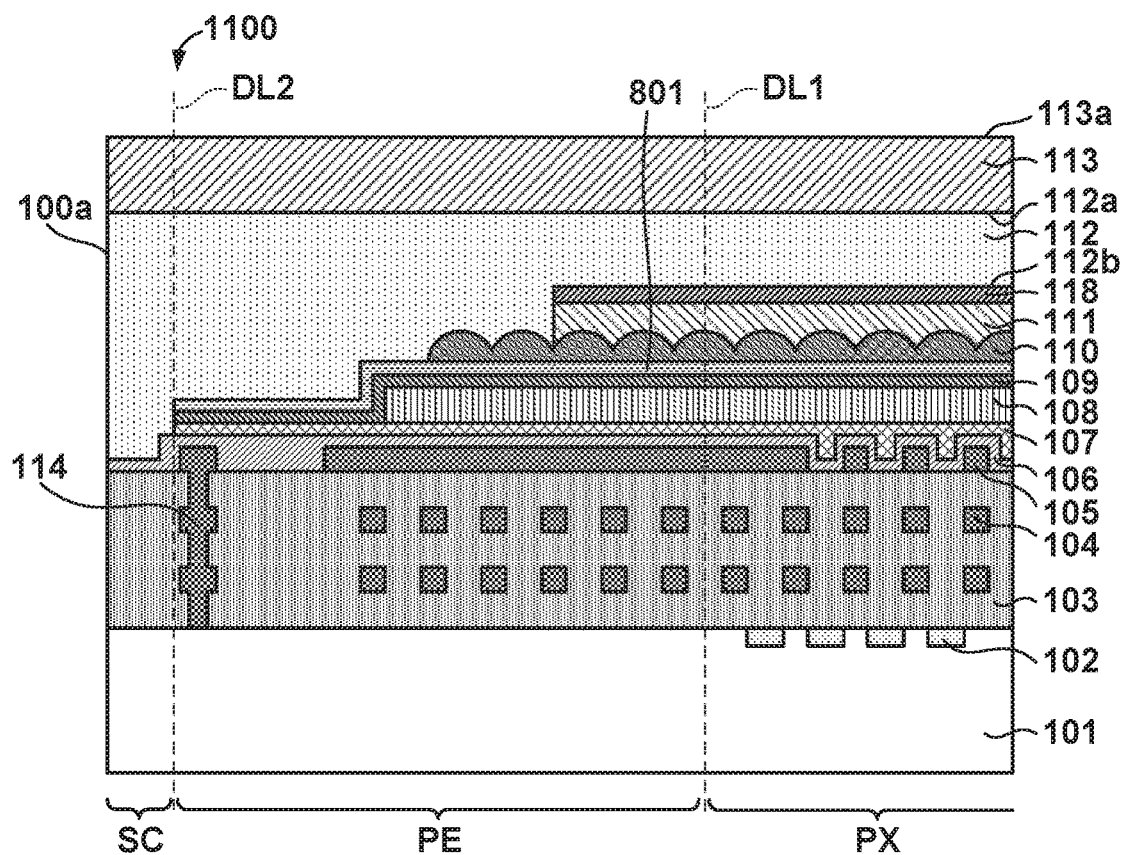
FIG. 11 is a view for describing another example of a structure of a photoelectric conversion apparatus in some embodiments.

A photoelectric conversion apparatus 1100 illustrated in FIG. 11 is different from the photoelectric conversion apparatus 100 in that it further comprises an intermediate film 1101. The intermediate film 1101 is arranged between the planarizing layer 109 and the microlens array 110. Specifically, the intermediate film 1101 is arranged between the plurality of photoelectric conversion portions 102 and the microlens array 110. On top of the plurality of photoelectric conversion portions 102, the microlens array 110 contacts the intermediate film 1101 and the intermediate film 1101 contacts the planarizing layer 109. A material of the intermediate film 1101 may be the same as the material of the intermediate film 801. The edge of the intermediate film 1101 extends to the edge of the planarizing layer 109. Instead of this, the edge of the intermediate film 1101 may be positioned somewhere between the edge of the low-refractive index member 111 and the edge of the microlens array 110. Furthermore, instead of providing the intermediate film 1101, configuration may be taken so that the planarizing layer 109 functions as a member having various effects such as reflection prevention, adhesion improvement, contamination prevention, and stress alleviation similar to the intermediate film 1101.

Figure 12A:
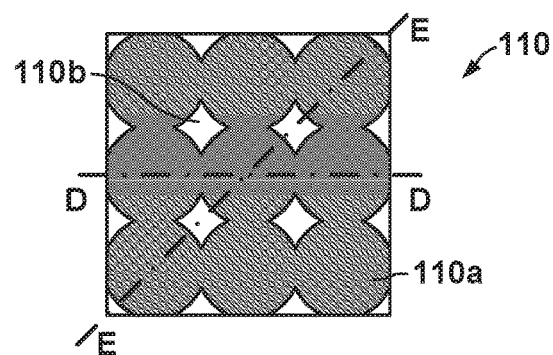
FIGS. 12A-12D are views for describing another example of a structure of a photoelectric conversion apparatus in some embodiments.

With reference to FIGS. 12A-12D, description is given regarding an example of the microlens array 110 of the photoelectric conversion apparatus according to various embodiments described above. FIG. 12A is a plan view focusing on a part of the microlens array 110. The microlens array 110 is configured by a plurality of microlenses 110a corresponding to a plurality of photoelectric conversion portions 102. The plurality of microlenses are arranged in an array similarly to the plurality of photoelectric conversion portions 102. The microlens array 110 has a region 110b that does not contribute to focusing between two microlenses 110a that are arranged in a diagonal direction in the array. The region 110b that does not contribute to focusing may be a portion that is flat compared to the unevenness according to the microlens 110a and that is formed by the same material as the microlens 110a. Also, the region 110b that does not contribute to focusing may be a portion in which another member (such as the low-refractive index member 111 or the intermediate film 801 as described later) is arranged. FIGS. 12A-12D describe the case of the latter.

Figure 12B:
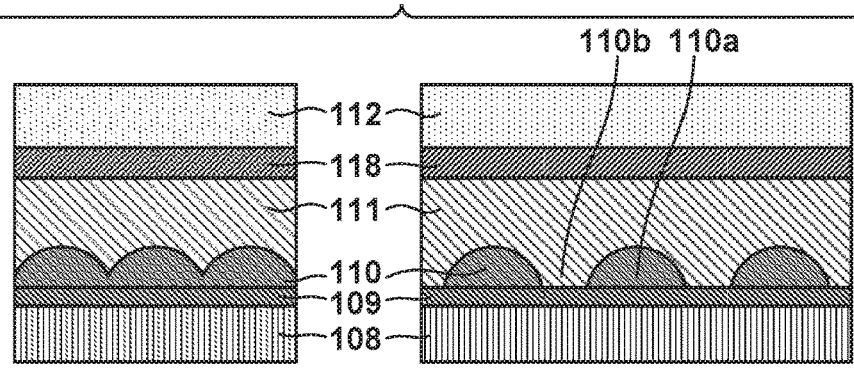
Figure 12C:
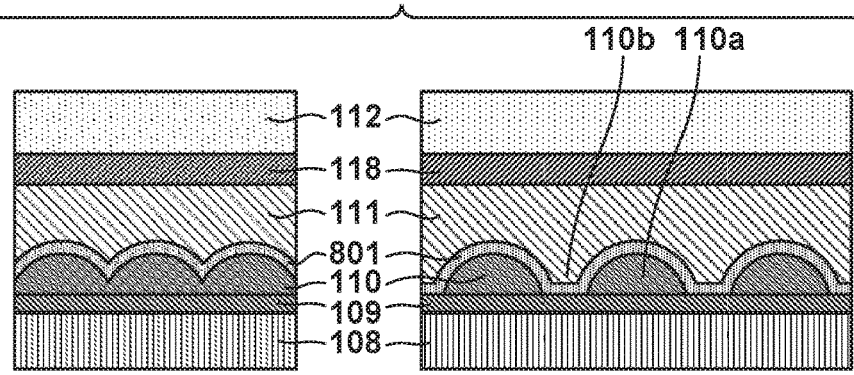
Figure 12D:
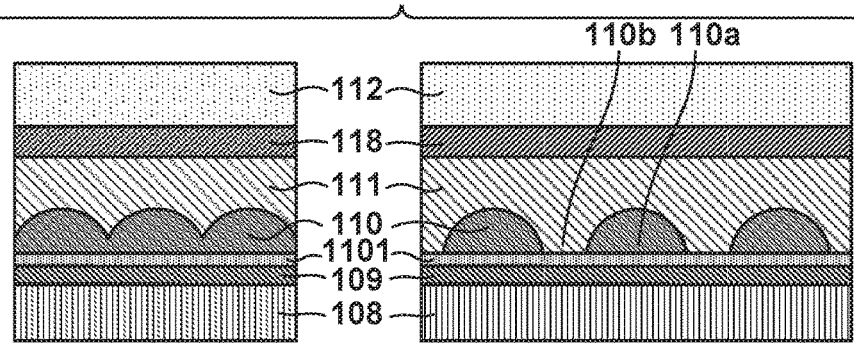

Each of FIG. 12B-FIG. 12D are cross-sectional views of portions including the microlens array 110 in the photoelectric conversion apparatus according to the various embodiments described above. The left side of each view is a DD line cross-sectional view of FIG. 12A, and the right side is an EE line cross-sectional view of FIG. 12A. FIG. 12B illustrates a cross-sectional view of the photoelectric conversion apparatus in which, as with the photoelectric conversion apparatus 100, the low-refractive index member 111 contacts the microlens array 110, and the microlens array 110 contacts the planarizing layer 109. In this example, in the region 110b that does not contribute to focusing, the low-refractive index member 111 contacts the planarizing layer 109. FIG. 12C illustrates a cross-sectional view of the photoelectric conversion apparatus in which the intermediate film 801 is arranged between the low-refractive index member 111 and the microlens array 110, as in the photoelectric conversion apparatus 800. In this example, in the region 110b that does not contribute to focusing, the low-refractive index member 111 contacts the intermediate film 801, and the intermediate film 801 contacts the planarizing layer 109. FIG. 12D illustrates a cross-sectional view of the photoelectric conversion apparatus in which the intermediate film 1101 is arranged between the planarizing layer 109 and the microlens array 110, as in the photoelectric conversion apparatus 1100. In this example, in the region 110b that does not contribute to focusing, the low-refractive index member 111 contacts the intermediate film 801. In the configurations of FIG. 12C and FIG. 12D out of the configurations of FIG. 12B-FIG. 12D, the intermediate film 801 or the intermediate film 1101 are arranged between the low-refractive index member 111 and the planarizing layer 109, and therefore it is possible to reduce the first-order reflection on the bottom surface of the low-refractive index member 111.

Hereinafter, a description is exemplarily given of a camera which is an example of a system in which this photoelectric conversion apparatus is embedded as an application of the photoelectric conversion apparatus according to each of the foregoing embodiments. Not only apparatuses whose main function is capturing but also systems having a supplemental capturing function (such as a personal computer, a mobile terminal, and an automobile for example) are included in the concept of camera. Also, the camera may be a modular part such as a camera head for example. The camera includes the photoelectric conversion apparatus according to the present invention as exemplified in the foregoing embodiments and a signal processor for processing a signal outputted from this photoelectric conversion apparatus. This signal processor may include a processor for processing digital data based on a signal obtained by the photoelectric conversion apparatus for example. An A/D converter for generating this digital data may be arranged in a semiconductor layer of the photoelectric conversion apparatus and may be arranged in a separate semiconductor layer. Also, it is possible to separately use a support substrate arranged on a side opposite to the light transmissive plate 113 with respect to the semiconductor layer 101 in a case where the semiconductor layer 101 is thinned to approximately 1 μm to 500 μm. On this support substrate, an A/D converter, a processor, a memory, or the like may be arranged.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-197546, filed Oct. 5, 2016, which is hereby incorporated by reference herein in its entirety.

What is claimed is:

1. A photoelectric conversion apparatus comprising:
a photoelectric conversion substrate having a plurality of photoelectric conversion portions and a microlens array arranged above the plurality of photoelectric conversion portions;
a light transmissive plate;
a first member arranged between the photoelectric conversion substrate and the light transmissive plate;
a second member arranged between the first member and the microlens array; and
a third member arranged between the first member and the second member,
wherein a porosity of the first member<a porosity of the third member<a porosity of the second member is satisfied.

2. A photoelectric conversion apparatus comprising:
a photoelectric conversion substrate having a plurality of photoelectric conversion portions and a microlens array arranged above the plurality of photoelectric conversion portions;
a light transmissive plate;
a first member arranged between the photoelectric conversion substrate and the light transmissive plate; and
a second member arranged between the first member and the microlens array; and
a third member arranged between the first member and the second member,
wherein at least one of (a) a refractive index of the first member>a refractive index of the third member>a refractive index of the second member, and (b) a porosity of the first member<a porosity of the third member<a porosity of the second member is satisfied, and
wherein above an apex of a microlens included in the microlens array, a thickness of the third member is less than a thickness of the second member.

3. The photoelectric conversion apparatus according to claim 1, wherein a film density of the third member>a film density of the second member is also satisfied.

4. The photoelectric conversion apparatus according to claim 2, wherein above the plurality of photoelectric conversion portions, the third member contacts the second member.

5. The photoelectric conversion apparatus according to claim 2, wherein above the plurality of photoelectric conversion portions, a top surface of the second member is flat.

6. The photoelectric conversion apparatus according to claim 2, wherein above the plurality of photoelectric conversion portions, a top surface of the third member is flat.

7. The photoelectric conversion apparatus according to claim 1, wherein the first member configures a part of a side surface of the photoelectric conversion apparatus.

8. The photoelectric conversion apparatus according to claim 1, wherein a side surface of the second member and a side surface of the third member are flush with each other.

9. The photoelectric conversion apparatus according to claim 1, wherein a material that configures the microlens array is arranged up until a side surface of the photoelectric conversion apparatus.

10. A photoelectric conversion apparatus comprising:
a photoelectric conversion substrate having a plurality of photoelectric conversion portions and a microlens array arranged above the plurality of photoelectric conversion portions;
a light transmissive plate;
a first member arranged between the photoelectric conversion substrate and the light transmissive plate;
a second member arranged between the first member and the microlens array; and
a third member arranged between the first member and the second member,
wherein at least one of (a) a refractive index of the first member>a refractive index of the third member>a refractive index of the second member, and (b) a porosity of the first member<a porosity of the third member<a porosity of the second member is satisfied,
wherein the photoelectric conversion apparatus further comprises a fourth member between the second member and the microlens array, and at least one of (a) a refractive index of the fourth member>the refractive index of the second member, and (b) a porosity of the fourth member<the porosity of the second member is satisfied, and
wherein the top surface of the fourth member has a lens shape.

11. The photoelectric conversion apparatus according to claim 10, wherein the microlens array has a region that does not contribute to focusing, and
wherein the fourth member, in the region that does not contribute to focusing, contacts a member below the microlens array.

12. The photoelectric conversion apparatus according to claim 2, wherein the photoelectric conversion apparatus further comprises a fourth member between the plurality of photoelectric conversion portions and the microlens array,
wherein at least one of (a) a refractive index of the microlens array>a refractive index of the fourth member>a refractive index of the second member, and (b) a porosity of the microlens array<a porosity of the fourth member<a porosity of the second member is satisfied, and
wherein above the plurality of photoelectric conversion portions, the microlens array contacts the fourth member.

13. The photoelectric conversion apparatus according to claim 1, wherein at least one of the second member and the third member includes a plurality of fillers bonded by a binder, and
wherein the at least one of the second member and the third member has voids between the plurality of fillers.

14. The photoelectric conversion apparatus according to claim 1, wherein at least one of the second member and the third member includes a plurality of fillers bonded by a binder, and
wherein the at least one has hollow structures between the plurality of fillers.

15. The photoelectric conversion apparatus according to claim 13, wherein the plurality of fillers contain a silica particle.

16. The photoelectric conversion apparatus according to claim 2, further comprising an electrode for soldering on a surface of a side opposite to the light transmissive plate,
wherein the electrode and the second member are arranged to have a space between them in a plan view for a top surface of the light transmissive plate.

17. The photoelectric conversion apparatus according to claim 1, wherein the first member is a member configured by an organic material.

18. A system, comprising:
the photoelectric conversion apparatus according to claim 1; and
a signal processor configured to process a signal outputted from the photoelectric conversion apparatus.

19. A system, comprising:
the photoelectric conversion apparatus according to claim 2; and
a signal processor configured to process a signal outputted from the photoelectric conversion apparatus.

20. A system, comprising:
the photoelectric conversion apparatus according to claim 10; and
a signal processor configured to process a signal outputted from the photoelectric conversion apparatus.

* * * * *